(12) United States Patent
Wang et al.

(10) Patent No.: US 11,703,925 B2
(45) Date of Patent: Jul. 18, 2023

(54) OUTDOOR DEVICE UNIT RESET SYSTEM

(71) Applicant: Huawei Technologies Co., Ltd., Shenzhen (CN)

(72) Inventors: Yongchao Wang, Xi'an (CN); Yiming Qi, Xi'an (CN); Lingjun Liu, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/614,904

(22) PCT Filed: May 26, 2020

(86) PCT No.: PCT/CN2020/092197
§ 371 (c)(1),
(2) Date: Nov. 29, 2021

(87) PCT Pub. No.: WO2020/238872
PCT Pub. Date: Dec. 3, 2020

(65) Prior Publication Data
US 2022/0236780 A1 Jul. 28, 2022

(30) Foreign Application Priority Data

May 30, 2019 (CN) .......................... 201910465061.8

(51) Int. Cl.
G05F 1/24 (2006.01)
G06F 1/24 (2006.01)
H03K 17/22 (2006.01)

(52) U.S. Cl.
CPC ............... *G06F 1/24* (2013.01); *H03K 17/22* (2013.01)

(58) Field of Classification Search
None
See application file for complete search history.

(56) References Cited

U.S. PATENT DOCUMENTS

| 5,502,416 | A | 3/1996 | Pietrobon |
| 7,248,831 | B1 | 7/2007 | Taskin et al. |
| 2008/0150497 | A1 | 6/2008 | Matano |
| 2010/0164550 | A1 | 7/2010 | Son |
| 2015/0161866 | A1 | 6/2015 | Jechart et al. |
| 2018/0183337 | A1 | 6/2018 | Huang |

FOREIGN PATENT DOCUMENTS

| CN | 103702460 B | 2/2016 |
| CN | 105874516 A | 8/2016 |
| CN | 205427663 U | 8/2016 |
| CN | 106533407 A | 3/2017 |
| CN | 206226401 U | 6/2017 |

(Continued)

*Primary Examiner* — Jeffery S Zweizig
(74) *Attorney, Agent, or Firm* — Conley Rose, P.C.

(57) ABSTRACT

An outdoor device reset system includes a voltage regulation apparatus coupled to a power supply apparatus and an outdoor device coupled to the voltage regulation apparatus. The voltage regulation apparatus is configured to regulate a working voltage input to the outdoor device based on a feedback signal, a supply voltage from the power supply apparatus for the voltage regulation apparatus, and a reference voltage of the voltage regulation apparatus. The outdoor device is configured to determine a change amount of the working voltage, and perform a reset operation when the change amount is within a preset range.

20 Claims, 8 Drawing Sheets

(56) References Cited

FOREIGN PATENT DOCUMENTS

| | | |
|---|---|---|
| CN | 107465262 A | 12/2017 |
| CN | 107632579 A | 1/2018 |
| CN | 108880249 A | 11/2018 |
| CN | 208386570 U | 1/2019 |
| CN | 109444583 A | 3/2019 |
| CN | 110289843 A | 9/2019 |

OUTDOOR DEVICE UNIT RESET SYSTEM

CROSS-REFERENCE TO RELATED APPLICATIONS

This is a U.S. National Stage of International Patent Application No. PCT/CN2020/092197 filed on May 26, 2020, which claims priority to Chinese Patent Application No. 201910465061.8 filed on May 30, 2019. Both of the aforementioned applications are hereby incorporated by reference in their entireties.

TECHNICAL FIELD

Embodiments of this application relate to the field of electronic communications technologies, and in particular, to an outdoor device unit reset system.

BACKGROUND

A high-frequency wireless signal sent by a base station attenuates to a relatively large extent after passing through a wall or a window, and only a relatively weak high-frequency wireless signal can be received indoors. It may be unable to implement full coverage of the high-frequency wireless signal at a corner of a room. To obtain a stronger high-frequency wireless signal, a wireless device is usually placed outdoors, that is, an outdoor device unit (outdoor device unit, ODU), and then a signal of the ODU is transmitted to an indoor device unit (indoor device unit, IDU) by using a network cable. Therefore, good wireless signal coverage is provided indoors by using the IDU.

Although a stronger high-frequency wireless signal may be obtained by disposing a combination of the ODU and the IDU, there are also some disadvantages. For example, when a user forgot a password, the user needs to reset a user name and the password by performing a reset operation on the ODU. As shown in FIG. 1, the ODU includes a reset switch K. The user needs to go outside to remove the ODU, and then touch and hold the reset switch K to trigger the reset operation. After detecting that the reset switch K is pressed, a central processing unit inside the ODU determines that there is a reset instruction, and therefore delivers an interrupt signal and implements resetting by using an internal program. In this process, the user needs to go outside and climb high to remove the device and remove a surface waterproof cover, and then reset the outdoor device unit by using the reset switch K on the outdoor device unit. The entire process is time- and effort-consuming and inefficient.

SUMMARY

Embodiments of this application provide an outdoor device unit reset system, to resolve a problem in a conventional technology that it is time- and effort-consuming to reset an ODU.

According to a first aspect, an embodiment of this application provides an outdoor device unit reset system, including a voltage regulation apparatus connected to a power supply apparatus and an outdoor device unit connected to the voltage regulation apparatus. The voltage regulation apparatus is configured to regulate, based on a detected feedback signal, a supply voltage provided by the power supply apparatus for the voltage regulation apparatus, and a reference voltage of the voltage regulation apparatus, a working voltage input to the outdoor device unit. The outdoor device unit is configured to: determine a change amount of the working voltage input to the outdoor device unit, and perform a reset operation when the change amount is within a preset range.

This embodiment of this application provides an outdoor device unit reset system. A voltage regulation apparatus is triggered by using a feedback signal to regulate an output voltage, so that a change amount of a working voltage input to an outdoor device unit is generated. The outdoor device unit determines, based on the change amount, to perform a reset operation, so that the outdoor device unit is remotely reset. Using the voltage regulation apparatus to trigger remote resetting of the outdoor device unit not only makes the operation convenient and avoids complexity of triggering a reset switch on the outdoor device unit but also adds a control function of the voltage regulation apparatus on an existing basis.

With reference to the first aspect, in a first possible implementation of the first aspect, the voltage regulation apparatus is specifically configured to: when it is ensured that the reference voltage is unchanged, regulate, based on the feedback signal and the supply voltage, the working voltage input to the outdoor device unit. The unchanged reference voltage is used as a reference to provide a basis for regulating the working voltage by the voltage regulation apparatus.

With reference to the first aspect and the first possible implementation of the first aspect, in a second possible implementation of the first aspect, the voltage regulation apparatus includes a conversion circuit and a reset unit connected to the conversion circuit; the reset unit is configured to input the feedback signal to the conversion circuit; and the conversion circuit is configured to regulate, based on the feedback signal, the supply voltage, and the reference voltage, the working voltage input to the outdoor device unit. The reset unit provides the feedback signal to trigger the conversion circuit to regulate the working voltage input to the outdoor device unit, so that the reset operation is triggered by using the voltage regulation apparatus, and complexity of triggering a reset switch on the outdoor device unit is avoided.

With reference to the second possible implementation of the first aspect, in a third possible implementation of the first aspect, the reset unit includes a first resistor, a second resistor, a third resistor, and a reset switch; and a first end of the first resistor and a first end of the second resistor are connected to an output end of the conversion circuit, the output end of the conversion circuit is further connected to the outdoor device unit, a second end of the first resistor is connected to a first end of the reset switch, a second end of the second resistor is connected to a second end of the reset switch, the second end of the reset switch is further connected to a first end of the third resistor, the first end of the third resistor is further connected to a feedback end of the conversion circuit, and a second end of the third resistor is grounded. Adding the first resistor, the second resistor, the third resistor, and the reset switch to constitute the reset unit to generate the feedback signal triggers the reset operation with a minimum change and minimum costs based on an existing apparatus.

With reference to the third possible implementation of the first aspect, in a fourth possible implementation of the first aspect, the reset switch is in a closed state when the change amount of the working voltage is within the preset range. Closing the reset switch can enable the change amount of the working voltage to be within the preset range. Therefore, the operation is time- and effort-saving.

With reference to any one of the first aspect to the fourth possible implementation of the first aspect, in a fifth possible implementation of the first aspect, the outdoor device unit is specifically configured to: determine that duration in which the change amount of the working voltage is within the preset range is greater than or equal to a preset threshold, and perform the reset operation. Determining that the duration in which the change amount of the working voltage is within the preset range is greater than or equal to the preset threshold can avoid resetting caused by an unintentional operation. Therefore, system reliability is improved.

With reference to any one of the first aspect to the fifth possible implementation of the first aspect, in a sixth possible implementation of the first aspect, the outdoor device unit includes a voltage divider unit connected to an output end of the voltage regulation apparatus and a power management module connected to the voltage divider unit; the voltage divider unit is configured to: divide the working voltage, and input a working voltage obtained after the voltage division to the power management module; and the power management module is configured to: determine a change amount of the working voltage obtained after the voltage division, and perform the reset operation when the change amount of the working voltage obtained after the voltage division is within the preset range. Because a voltage detection range of the power management module is limited, to implement application of the system in reality, the voltage divider unit may be disposed to reduce the change amount of the working voltage, so that system practicality is improved.

With reference to the sixth possible implementation of the first aspect, in a seventh possible implementation of the first aspect, the voltage divider unit includes a fourth resistor, a fifth resistor, and a first capacitor; and a first end of the fourth resistor is connected to the output end of the voltage regulation apparatus, a second end of the fourth resistor is connected to a first end of the fifth resistor, the first end of the fifth resistor is further connected to the power management module and a first end of the first capacitor, a second end of the fifth resistor is grounded, and the second end of the fifth resistor is further connected to a second end of the first capacitor. Adding the fourth resistor and the fifth resistor to divide the working voltage not only implements low input costs but also is highly practical.

With reference to the seventh possible implementation of the first aspect, in an eighth possible implementation of the first aspect, the preset range is a range including endpoints that is formed by a product of a preset standard change amount and a first percentage and a product of the preset standard change amount and a second percentage, and the first percentage is less than the second percentage. Setting the first percentage and the second percentage can expand a range of the change amount. Therefore, error tolerance of the system is increased.

With reference to any one of the first aspect to the eighth possible implementation of the first aspect, in a ninth possible implementation of the first aspect, the outdoor device unit is further configured to determine not to perform the reset operation when the change amount of the working voltage falls beyond the preset range.

According to a second aspect, an embodiment of this application provides an outdoor device unit reset method, applied to an outdoor device unit reset system. The outdoor device unit reset system includes a voltage regulation apparatus and an outdoor device unit, and the method includes: The voltage regulation apparatus regulates, based on a detected feedback signal, a supply voltage provided by a power supply apparatus for the voltage regulation apparatus, and a reference voltage of the voltage regulation apparatus, a working voltage input to the outdoor device unit; and the outdoor device unit determines a change amount of the working voltage input to the outdoor device unit, and performs a reset operation when the change amount is within a preset range.

This embodiment of this application provides an outdoor device unit reset method. A voltage regulation apparatus regulates, based on a detected feedback signal, a supply voltage provided by a power supply apparatus for the voltage regulation apparatus, and a reference voltage of the voltage regulation apparatus, a working voltage input to an outdoor device unit. The outdoor device unit determines a change amount of the working voltage input to the outdoor device unit, and performs a reset operation when the change amount is within a preset range. This method not only implements remote reset control on the outdoor device unit, but also is not limited by device binding because the method is an improvement to the voltage regulation apparatus.

With reference to the second aspect, in a first possible implementation of the second aspect, that the voltage regulation apparatus regulates, based on a detected feedback signal, a supply voltage provided by a power supply apparatus for the voltage regulation apparatus, and a reference voltage of the voltage regulation apparatus, a working voltage input to the outdoor device unit includes: When it is ensured that the reference voltage is unchanged, the voltage regulation apparatus regulates, based on the feedback signal and the supply power, the working voltage input to the outdoor device unit.

With reference to the second aspect and the first possible implementation of the second aspect, in a second possible implementation of the second aspect, the voltage regulation apparatus includes a conversion circuit and a reset unit connected to the conversion circuit, and that the voltage regulation apparatus regulates, based on a detected feedback signal, a supply voltage provided by a power supply apparatus for the voltage regulation apparatus, and a reference voltage of the voltage regulation apparatus, a working voltage input to the outdoor device unit specifically includes: The reset unit inputs the feedback signal to the conversion circuit; and the conversion circuit regulates, based on the feedback signal, the supply voltage, and the reference voltage, the working voltage input to the outdoor device unit.

With reference to the second aspect, in a third possible implementation of the second aspect, a reset switch is in a closed state when the change amount of the working voltage is within the preset range.

With reference to any one of the second aspect to the third possible implementation of the second aspect, in a fourth possible implementation of the second aspect, the method further includes: The outdoor device unit determines that duration in which the change amount of the working voltage is within the preset range is greater than or equal to a preset threshold, and the outdoor device unit performs the reset operation.

With reference to any one of the second aspect to the fourth possible implementation of the second aspect, in a fifth possible implementation of the second aspect, the outdoor device unit includes a voltage divider unit and a power management module, and that the outdoor device unit determines a change amount of the working voltage input to the outdoor device unit, and performs a reset operation when the change amount is within a preset range specifically includes: The voltage divider unit divides the working voltage, and inputs a working voltage obtained after the voltage division to the power management module; and the power management module determines a change amount of the working voltage obtained after the voltage division, and performs the reset operation when the change amount of the working voltage obtained after the voltage division is within the preset range.

With reference to the second aspect, in a sixth possible implementation of the second aspect, the preset range is a range including endpoints that is formed by a product of a preset standard change amount and a first percentage and a product of the preset standard change amount and a second percentage, and the first percentage is less than the second percentage.

With reference to any one of the second aspect to the fourth possible implementation of the second aspect, in a seventh possible implementation of the second aspect, the method further includes: The outdoor device unit determines not to perform the reset operation when the change amount of the working voltage falls beyond the preset range.

DESCRIPTION OF EMBODIMENTS

To facilitate clear description of the technical solutions in the embodiments of this application, terms such as "first" and "second" are used in the embodiments of this application to distinguish between same items or similar items that provide basically same functions or purposes. For example, a first resistor and a second resistor are merely used to distinguish between different resistors, and do not limit a sequence. Persons skilled in the art may understand that the terms such as "first" and "second" do not limit a quantity or an execution sequence, and the terms such as "first" and "second" do not mean absolutely different either.

It should be noted that, in this application, the term such as "example" or "for example" is used to represent giving an example, an illustration, or a description. Any embodiment or design scheme described as an "example" or "for example" in this application should not be explained as being more preferred or having more advantages than another embodiment or design scheme. Exactly, use of the term such as "example" or "for example" is intended to present a related concept in a specific manner.

In this application, "at least one" means one or more, and "a plurality of" means two or more. The term "and/or" describes an association relationship between associated objects and represents that three relationships may exist. For example, A and/or B may represent the following three cases: Only A exists, both A and B exist, and only B exists, where A and B may be singular or plural. The character "/" generally indicates an "or" relationship between the associated objects. "At least one of the following items (pieces)" or a similar expression thereof means any combination of the items, including any combination of singular items (pieces) or plural items (pieces). For example, at least one of a, b, or c may represent a, b, c, "a and b", "a and c", "b and c", or "a, b, and c", where a, b, and c may be singular or plural.

For an outdoor device unit reset method, in addition to using a reset switch included in an ODU, a reset instruction may be delivered by logging in to a web user interface (web user interface, Web UI) or an application (Application, APP). After identifying the instruction, built-in software of the ODU delivers an interrupt signal and implements resetting. Although resetting can be triggered remotely in this manner, the reset operation cannot be implemented when a user fails to access the Internet or forgot a login password.

Figure 1:
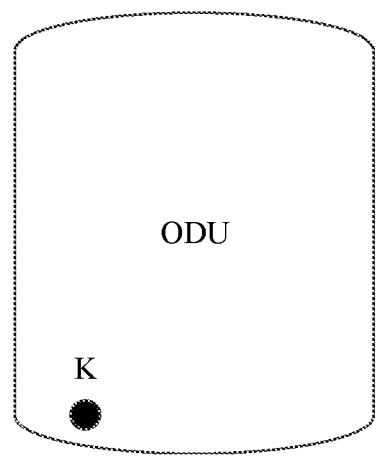
FIG. 1 is a schematic structural diagram in which a reset switch is disposed on an outdoor device unit in a conventional technology according to an embodiment of this application.
Figure 2:
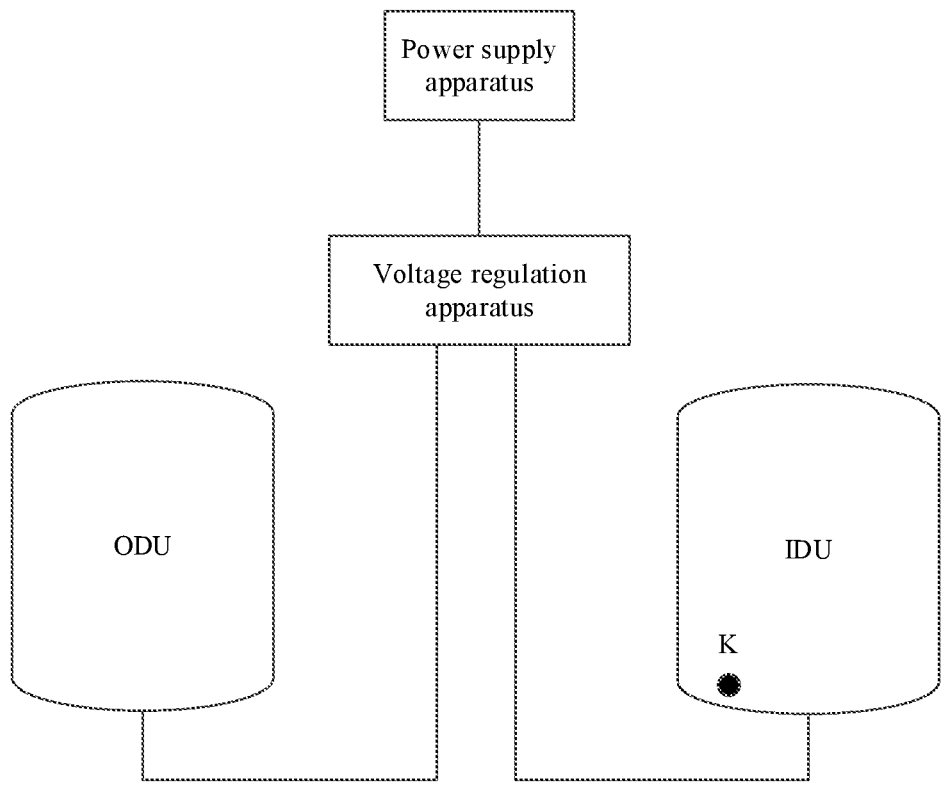
FIG. 2 is a schematic structural diagram in which a reset switch is disposed on an indoor device unit in a conventional technology according to an embodiment of this application.

In another implementation, as shown in FIG. 2, both an IDU and an ODU are connected to a voltage regulation apparatus, and the voltage regulation apparatus is configured to: regulate a supply voltage provided by a power supply apparatus, and transmit a control instruction between the IDU and the ODU. The IDU includes a reset switch K. The IDU and the ODU can be managed together by using the reset switch K. In other words, the IDU and the ODU can be reset at the same time after the reset switch K is pressed.

Specifically, a reset instruction may be triggered by manually pressing the reset switch K on the IDU. The reset instruction is transmitted to the voltage regulation apparatus by using a network cable, and then is transmitted to the ODU by the voltage regulation apparatus. After identifying the instruction, built-in software of the ODU delivers an interrupt signal and implements resetting. Although resetting can also be triggered remotely in this manner, if a user uses a third-party IDU for networking with the ODU, there is no binding relationship between the IDU and the ODU, and therefore the user cannot remotely control, by using the IDU device, the ODU to reset.

Based on this, an outdoor device unit reset system needs to be provided to resolve a problem that it is convenient or condition-restrictive to perform an operation on the outdoor device unit.

Figure 3:
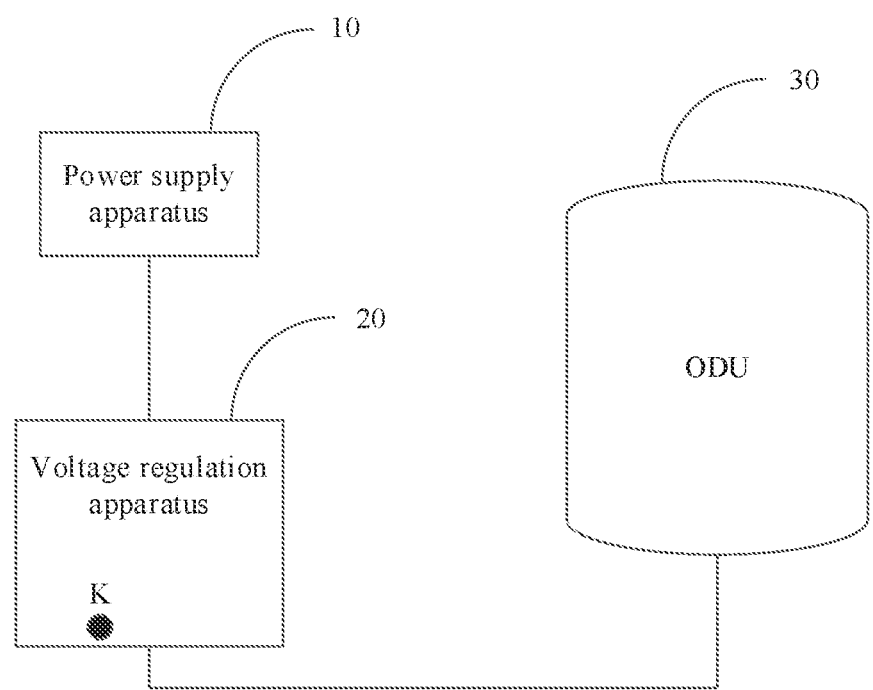
FIG. 3 is a schematic structural diagram of an outdoor device unit reset system according to an embodiment of this application.

As shown in FIG. 3, an embodiment of this application provides an outdoor device unit reset system, including a voltage regulation apparatus 20 connected to a power supply apparatus 10 and an outdoor device unit 30 connected to the voltage regulation apparatus 20.

The voltage regulation apparatus 20 is configured to regulate, based on a detected feedback signal, a supply voltage provided by the power supply apparatus for the voltage regulation apparatus, and a reference voltage of the voltage regulation apparatus, a working voltage input to the outdoor device unit. The outdoor device unit 30 is configured to: determine a change amount of the working voltage input to the outdoor device unit, and perform a reset operation when the change amount is within a preset range.

The voltage regulation apparatus 20 is configured to process an alternating current provided by the power supply apparatus 10 into a direct current, to output the working voltage to the outdoor device unit 30. In addition, the voltage regulation apparatus 20 may further play a control role in the reset system. The voltage regulation apparatus 20 regulates, based on the detected feedback signal, the supply voltage provided by the power supply apparatus 10 for the voltage regulation apparatus 20, and the reference voltage of the voltage regulation apparatus 20, the working voltage input to the outdoor device unit 30. In other words, the voltage regulation apparatus 20 regulates the supply voltage through triggering of the feedback signal by using the reference voltage as a reference, to implement control on the outdoor device unit 30.

The outdoor device unit 30 is configured to: determine the change amount of the working voltage input to the outdoor device unit 30, and perform the reset operation when the change amount is within the preset range. Through regulation of the voltage regulation apparatus 20, the working voltage input to the outdoor device unit 30 changes. The outdoor device unit 30 may detect the change amount of the working voltage. When the change amount is within the preset range, the reset operation is performed by using built-in software.

This embodiment of this application provides an outdoor device unit reset system. A voltage regulation apparatus is triggered by using a feedback signal to regulate an output voltage, so that a change amount of a working voltage input to an outdoor device unit is generated. The outdoor device unit determines, based on the change amount, to perform a reset operation, so that the outdoor device unit is remotely reset. Using the voltage regulation apparatus to trigger remote resetting of the outdoor device unit not only makes the operation convenient and avoids complexity of triggering a reset switch on the outdoor device unit but also adds a control function of the voltage regulation apparatus on an existing basis. In addition, impact on an original system is minimum, and an increase in costs is also minimum.

In this embodiment of this application, the power supply apparatus 10 may supply mains electricity, and the power supply apparatus 10 provides an industrial-frequency alternating current (alternating current, AC). The industrial-frequency alternating current needs to be processed by the voltage regulation apparatus 20, in other words, converted into a direct current (direct current, DC), to obtain a working voltage that can ensure normal working of the outdoor device unit 30.

In this embodiment of this application, the voltage regulation apparatus 20 may be a power over Ethernet (power over ethernet, PoE) adapter.

Figure 4:
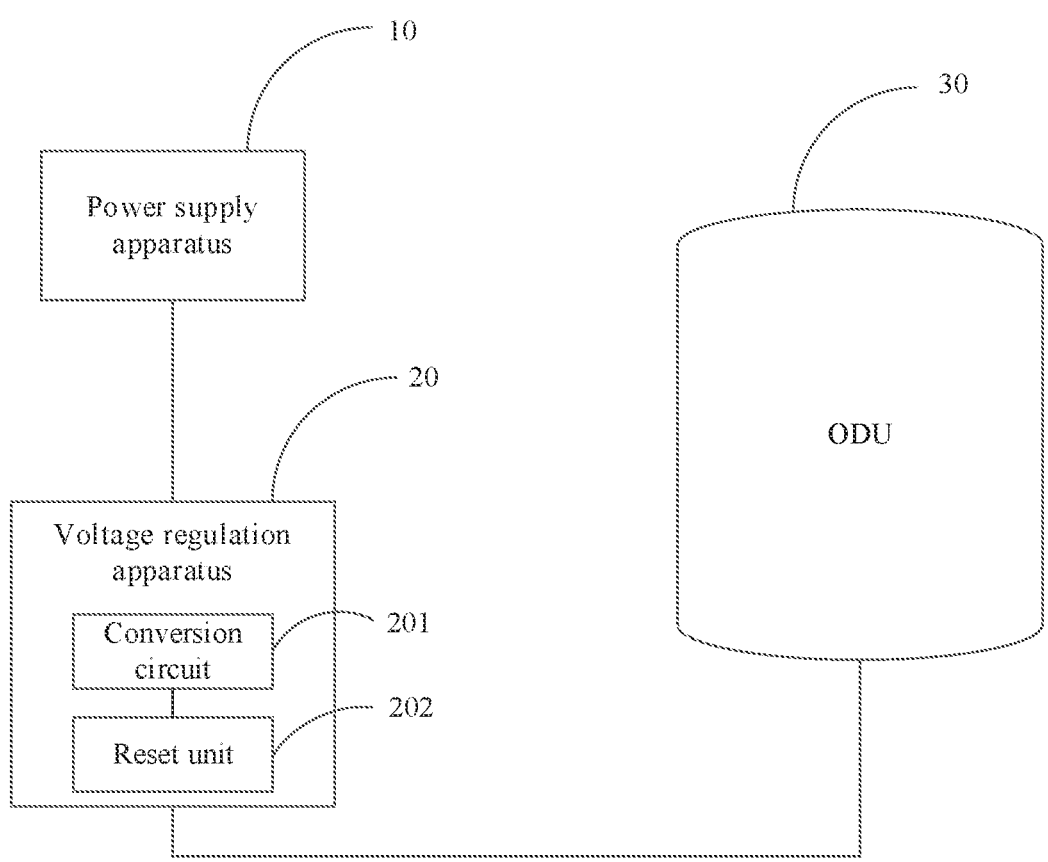
FIG. 4 is a schematic structural diagram of a voltage regulation apparatus in an outdoor device unit reset system according to an embodiment of this application.

Optionally, referring to FIG. 4, the voltage regulation apparatus 20 includes a conversion circuit 201 and a reset unit 202 connected to the conversion circuit 201. The reset unit 202 is configured to input the feedback signal to the conversion circuit 201, and the conversion circuit 201 is configured to regulate, based on the feedback signal, the supply voltage, and the reference voltage, the working voltage input to the outdoor device unit 30.

Specifically, the reset unit 202 generates the feedback signal through the reset operation. The reset unit 202 may generate the feedback signal by changing a voltage of a feedback end through external triggering or in another manner, and input the feedback signal to the conversion circuit 201. Correspondingly, the conversion circuit 201 receives the feedback signal, and after determining that the voltage of the feedback end deviates from the reference voltage, the conversion circuit 201 keeps the voltage of the feedback end unchanged as the reference voltage by regulating the working voltage.

Optionally, the voltage regulation apparatus 20 is specifically configured to: when it is ensured that the reference voltage is unchanged, regulate, based on the feedback signal and the supply voltage, the working voltage input to the outdoor device unit 30. The reference voltage refers to an ideal value of the voltage of the feedback end of the voltage regulation apparatus 20.

Figure 5:
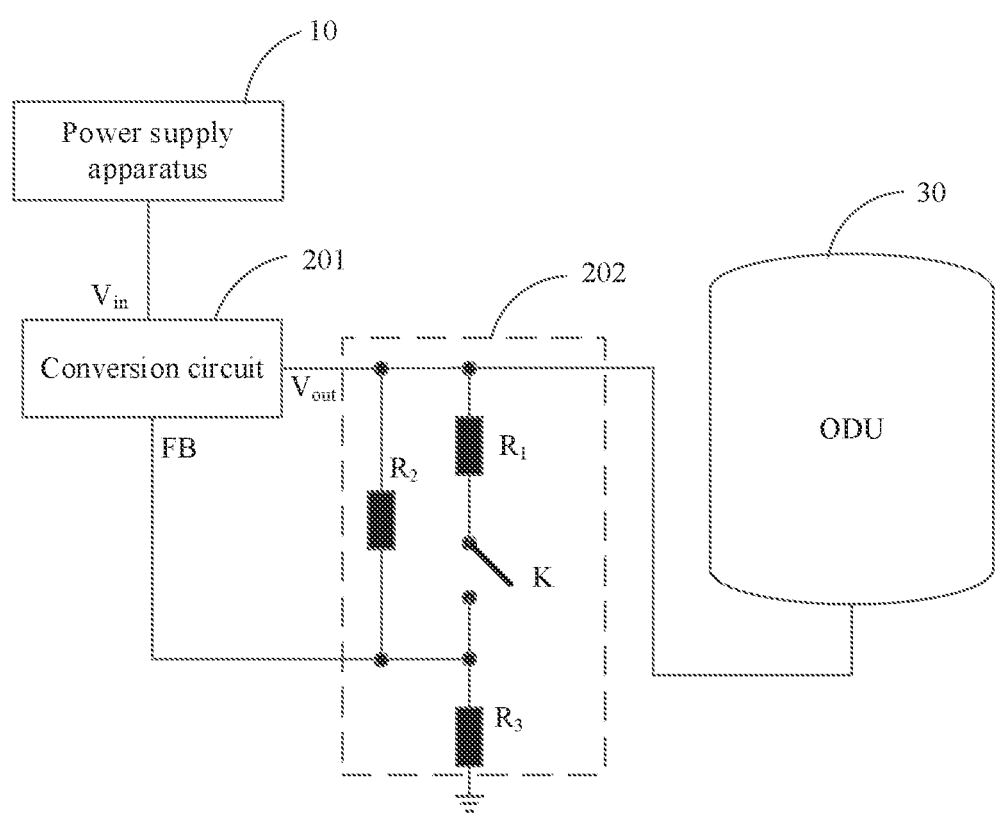
FIG. 5 is a circuit diagram of a reset unit in an outdoor device unit reset system according to an embodiment of this application.

For example, referring to FIG. 5, the voltage regulation apparatus 20 includes an input end $V_{in}$, a feedback (feedback, FB) end, and an output end $V_{out}$. The input end $V_{in}$ is configured to connect to the power supply apparatus 10 to receive an industrial-frequency alternating current, and the output end $V_{out}$ is configured to connect to the outdoor device unit 30 to provide a working voltage for the outdoor device unit 30. The feedback FB end is configured to receive a feedback signal. The feedback signal may be generated by changing a voltage of the feedback end, and the reference voltage is an ideal value of the voltage of the feedback end. Because the reference voltage is set to a fixed value, after determining that the voltage of the feedback end changes, the voltage regulation apparatus 20 regulates the working voltage by using the reference voltage as a reference, to keep the reference voltage of the feedback end unchanged.

Optionally, further referring to FIG. 5, the reset unit 202 includes a first resistor $R_1$, a second resistor $R_2$, a third resistor $R_3$, and a reset switch K. An input end of the conversion circuit 201 is connected to the power supply apparatus 10. A first end of the first resistor $R_1$ and a first end of the second resistor $R_2$ are connected to an output end of the conversion circuit 201, and the output end of the conversion circuit 201 is further connected to the outdoor device unit 30. A second end of the first resistor $R_1$ is connected to a first end of the reset switch K, a second end of the second resistor $R_2$ is connected to a second end of the reset switch K, and the second end of the reset switch K is further connected to a first end of the third resistor $R_3$. The first end of the third resistor $R_3$ is further connected to a feedback end of the conversion circuit 201, and a second end of the third resistor $R_3$ is grounded.

It should be understood that the output end of the conversion circuit 201 is the output end $V_{out}$ of the voltage regulation apparatus 20, and the feedback end of the conversion circuit 201 is the feedback FB end of the voltage regulation apparatus 20.

In this embodiment of this application, the feedback signal is generated based on a closed state or an open state of the reset switch K.

Specifically, when the reset switch K is in the open state, for one channel, the output end of the conversion circuit 201 is connected to the second resistor $R_2$ and the third resistor $R_3$ and then to the ground, and the voltage of the feedback end is a voltage on the third resistor $R_3$ that is obtained through division. According to a voltage divider principle of resistors connected in parallel, in this case, an association relationship between the working voltage $V_{out1}$ output by the voltage regulation unit 20 and the voltage $V_{fb}$ of the feedback end is:

$$V_{fb}=V_{out1} \times R_3/(R_2+R_3), \text{ that is, } V_{out1}=V_{fb} \times (R_2+R_3)/R_3.$$

When the reset switch K is in the closed state, the conversion circuit 201 is connected to the reset unit 202. Specifically, the output end of the conversion circuit 201 is connected to a parallel circuit of the first circuit $R_1$ and the second resistor $R_2$ and then to the ground by using the third resistor $R_3$, and the voltage of the feedback end is still a voltage on the third resistor $R_3$ that is obtained through division. According to a voltage divider principle of resistors connected in parallel, in this case, an association relationship between the working voltage $V_{out2}$ output by the voltage regulation unit 20 and the voltage $V_{fb}$ of the feedback end is:

$$V_{fb}=V_{out2} \times R_3/\{[R_2 \times R_1/(R_2+R_1)]+R_3\},$$

that is, $V_{out2}=V_{fb} \times \{[R_2 \times R_1/(R_2+R_1)]+R_3\}/R_3.$

It can be learned from the foregoing analysis that when the reset switch K is in the closed state, the voltage on the third resistor $R_3$ that is obtained through division changes, and to keep the voltage $V_{fb}$ of the feedback end as a fixed value, that is, as the reference voltage, the conversion circuit 201 needs to regulate the working voltage provided to the outdoor device unit 30.

Figure 6:
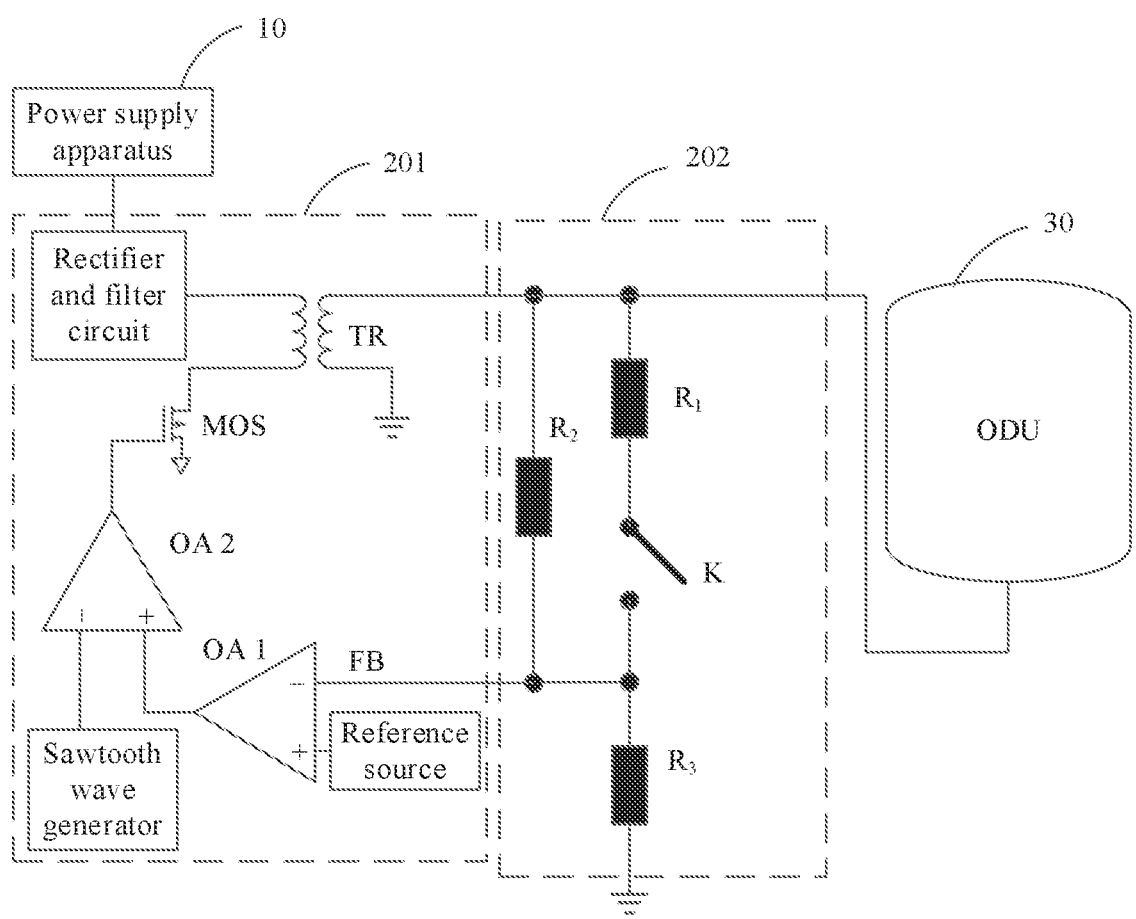
FIG. 6 is a schematic diagram of a conversion circuit in an outdoor device unit reset system according to an embodiment of this application.

Specifically, referring to FIG. 6, the conversion circuit 201 includes a rectifier and filter circuit, a transformer (transformer, TR), an operational amplifier (Operational amplifier, OA) 1, an operational amplifier OA 2, a sawtooth wave generator, a reference source, a metal-oxide-semiconductor field-effect transistor (metal oxide semiconductor field effect transistor, MOS), and the like.

An input end of the rectifier and filter circuit is connected to the power supply apparatus 10, and an output end of the rectifier and filter circuit is connected to a first input end of the transformer TR. An output end of the transformer TR is the output end of the conversion circuit 201. The feedback end of the conversion circuit 201 is connected to a reverse input end of the operational amplifier OA 1, and a co-directional input end of the operational amplifier OA 1 is connected to the reference source. The reference source is configured to provide a reference voltage. An output end of the operational amplifier OA 1 is connected to a co-directional input end of the operational amplifier OA 2, a reverse input end of the operational amplifier OA 2 is connected to the sawtooth wave generator, and an output end of the operational amplifier OA 2 is connected to a first end of the MOS transistor. A second end of the MOS transistor is connected to a second input end of the transformer TR.

When the reset switch K is in the open state, the rectifier and filter circuit outputs the voltage $V_{out1}$, and a voltage obtained after the voltage $V_{out1}$ is divided by using the second resistor $R_2$ and the third resistor $R_3$ is connected to the feedback FB end. When the reset switch K is closed, the first resistor $R_1$ and the second resistor $R_2$ that are connected in parallel perform voltage division with the third resistor $R_3$, causing the voltage of the FB end to be larger. After error amplification is performed on the voltage of the FB end and the voltage of the reference source, an output end voltage is reduced, the output end voltage is compared in the sawtooth wave generator, and a comparison result is input to the MOS transistor. A duty cycle of a square wave output by the sawtooth wave generator is reduced, so that a conduction time of the MOS transistor is reduced, and energy transmitted to a subsequent stage is reduced, thereby outputting the voltage $V_{out2}$. When the reset switch K is in the open state again, the voltage of the FB end that is obtained through division becomes smaller, the duty cycle of the square wave becomes larger, and the output voltage becomes $V_{out1}$ again.

In this embodiment of this application, the voltage regulation process of the conversion circuit 201 is only briefly described. For details, refer to related descriptions in a conventional technology. Details are not described herein.

Optionally, the reset switch K is in the closed state when the outdoor device unit 30 determines that the change amount of the working voltage input to the outdoor device unit 30 is within the preset range. It should be noted that the change amount of the working voltage of the outdoor device unit 30 may be enabled to be within the preset range by closing the reset switch K, or may be enabled to be within the preset range in a manner other than closing the reset switch K. This is not limited in this embodiment of this application.

In a possible implementation, to avoid resetting caused by unintentional touch of the reset switch K, the outdoor device unit 30 in this embodiment of this application is specifically configured to: determine that duration in which the change amount of the working voltage is within the preset range is greater than or equal to a preset threshold, and perform the reset operation.

For example, when the reset switch K is in the open state, the working voltage input to the outdoor device unit 30 is 19 V, when the reset switch K is in the closed state, the working voltage input to the outdoor device unit 30 is 16 V, and the preset range is 2 V to 4 V. A change amount of the working voltage in the two states is 3 V, and is within the preset range 2 V to 4 V. The outdoor device unit 30 detects the change amount of the working voltage, but the change amount is probably caused by an unintentional operation. Therefore, to avoid performing the reset operation due to an unintentional operation, on this basis, it further needs to be determined that the duration in which the change amount is within the preset range is greater than or equal to the preset threshold. In other words, the reset operation can be triggered only when a time in which the reset switch K is in the closed state exceeds a preset time threshold. Therefore, system reliability is improved.

It should be noted that when the reset switch K is in the closed state, the working voltage input to the outdoor device unit 30 needs to meet a requirement of the outdoor device unit 30 for normal working. In other words, when the reset switch K is in the closed state, the working voltage of the outdoor device unit 30 needs to be greater than a minimum voltage at which the outdoor device unit 30 can work normally. In this embodiment of this application, in consideration of an output capability of the voltage regulation apparatus 20 and a voltage drop on a network cable, a proper divided voltage is set by using the reset unit 202, and the outdoor device unit 30 can still work normally in a process of triggering the reset switch K by a user.

In a feasible implementation, the outdoor device unit 30 determines, in the following method, that the duration in which the change amount is within the preset range is greater than or equal to the preset threshold: The outdoor device unit 30 includes a timer. The timer starts to time when the outdoor device unit 30 detects that the change amount of the working voltage is within the preset range. The outdoor device unit 30 detects the change amount of the working voltage at intervals of a preset time, and determines whether the change amount is within the preset range. The timer stops timing when the change amount of the working voltage falls beyond the preset range. The outdoor device unit 30 determines whether a time of the timer is greater than or equal to the preset threshold. If the time of the timer is greater than or equal to the preset threshold, the outdoor device unit 30 may determine that the duration in which the change mount is in the preset range is greater than or equal to the preset threshold.

In another feasible implementation, the outdoor device unit 30 may alternatively determine, by detecting a quantity of times the change amount of the working voltage is within the preset range, that the duration in which the change amount is within the preset range is greater than or equal to the preset threshold. Specifically, a timer and a counter are disposed in the outdoor device unit 30. The timer starts to time after the outdoor device unit 30 detects that the change amount of the working voltage is within the preset range. The outdoor device unit 30 detects the change amount of the working voltage at intervals of a preset time, and determines whether the change amount is within the preset range. If the change amount is within the preset range, counts of the counter are increased by 1, and when the counts of the counter are equal to a preset count value, the outdoor device unit 30 may determine that the duration in which the change amount is within the preset range is greater than or equal to the preset threshold.

It should be noted that a product of the preset time and the preset count value in this implementation should be equal to the preset threshold. For example, if the preset threshold is 5 seconds, the preset time may be 1 second, and the preset count value may be 5.

It should be noted that when the reset switch K is in the open state again, the working voltage is restored to the start-state voltage, namely, the working voltage before the reset switch K is closed. Because the outdoor device unit 30 detects only a voltage falling edge and does not detect a rising edge, the outdoor device unit 30 still does not perform the reset operation although the working voltage changes.

Figure 7:
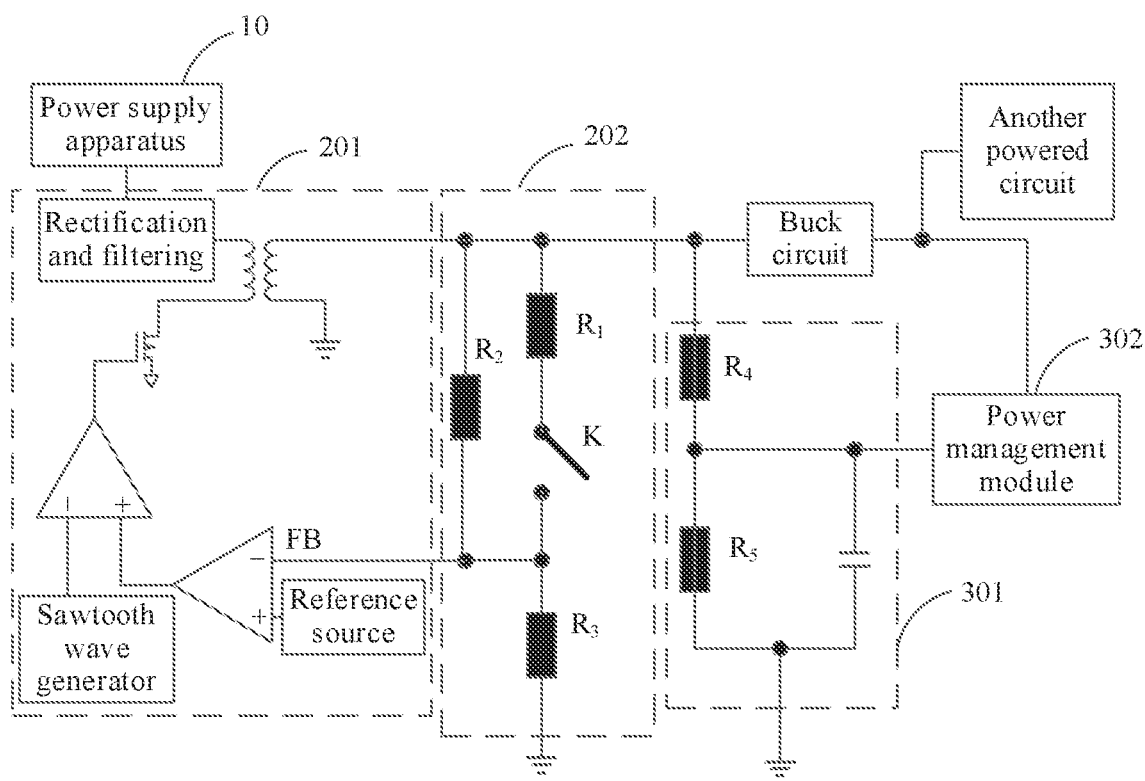
FIG. 7 is a schematic diagram of an outdoor device unit in an outdoor device unit reset system according to an embodiment of this application.
Figure 8:
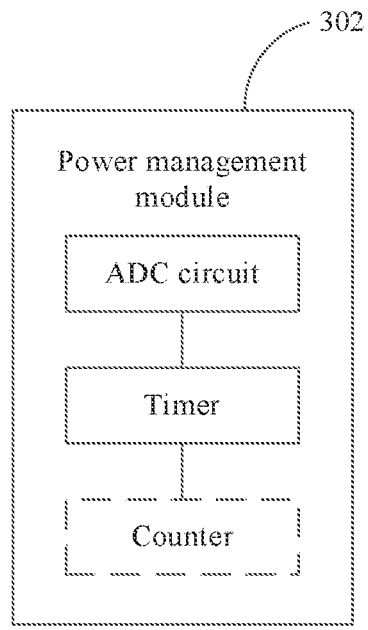
FIG. 8 is a schematic diagram of a power management module in an outdoor device unit reset system according to an embodiment of this application.

Optionally, referring to FIG. 7, the outdoor device unit 30 includes a voltage divider unit 301 connected to an output end of the voltage regulation apparatus 20 and a power management module 302 connected to the voltage divider unit 301. Referring to FIG. 8, the power management module 302 includes one or more of a digital-to-analog converter (analogue-to-digital converter, ADC) circuit, a timer, and a counter. The voltage divider unit 301 is configured to: divide the working voltage, and input a working voltage obtained after the voltage division to the power management module 302. The power management module 302 is configured to: determine a change amount of the working voltage obtained after the voltage division, and perform the reset operation when the change amount of the working voltage obtained after the voltage division is within the preset range.

Specifically, because the working voltage input by the voltage regulation apparatus 20 to the power management module 302 may exceed a voltage range that can be detected by the power management module 302, the working voltage needs to be divided by using the voltage divider unit 301.

For example, the working voltage input by the voltage regulation apparatus 20 to the power management module 302 is 19 V, a minimum working voltage at which the outdoor device unit 30 can work normally is 12 V, and the working voltage output by the voltage regulation apparatus 20 is reduced to 16.5 V by using the reset unit 202. On a side of the outdoor device unit 30, the voltage divider unit 301 is added before a buck circuit, and the voltage obtained after the voltage division is input to the ADC circuit in the power management module 302, and the change amount of the working voltage on the ADC circuit that is obtained after the voltage division is 230 mV. The ADC circuit sends the detected change amount of the working voltage to a central processing unit inside the power management module 302, so that the central processing unit can learn of the change amount of the working voltage. When the change amount of the working voltage is within the preset range, the central processing unit delivers a reset instruction, and performs the reset operation by using software.

It should be noted that the outdoor device unit 30 further includes the buck circuit and another powered circuit. Because these circuits do not affect a result of this embodiment of this application, details are not described.

Optionally, further referring to FIG. 7, the voltage divider unit 301 includes a fourth resistor $R_4$, a fifth resistor $R_5$, and a first capacitor $C_1$. A first end of the fourth resistor $R_4$ is connected to the output end of the voltage regulation apparatus 20, a second end of the fourth resistor $R_4$ is connected to a first end of the fifth resistor $R_5$, the first end of the fifth resistor $R_5$ is further connected to the power management module 302 and a first end of the first capacitor $C_1$, a second end of the fifth resistor is $R_5$ is grounded, and the second end of the fifth resistor $R_5$ is further connected to a second end of the first capacitor $C_1$.

Specifically, the fourth resistor $R_4$ and the fifth resistor $R_5$ divide the working voltage, and the voltage on the ADC circuit that is obtained after the voltage division is equal to a voltage on the fifth resistor $R_5$. Therefore, the change amount of the voltage on the ADC circuit, namely, a preset standard change amount, is $(V_{out1}-V_{out2}) \times R_5/(R_4+R_5)$.

Optionally, the power management module 302 performs the reset operation when the change amount of the voltage is within the preset range. The preset range is being greater than a product of the preset standard change amount and a first percentage and being less than a product of the preset standard change amount and a second percentage. The preset standard change amount may be calculated by using a circuit relationship, that is, the preset standard change amount may be $(V_{out1}-V_{out2}) \times R_5/(R_4+R_5)$; or may be set based on an empirical value. The first percentage is less than the second percentage. In other words, the change amount of the voltage may fluctuate by using the preset standard change amount as a reference. For example, the first percentage may be 1−a %, and the second percentage may be 1+a %, where a is greater than 1 and less than or equal to 20.

For example, if a is 5, the first percentage is 0.95, and the second percentage is 1.05, the preset range may be:

being greater than $(V_{out1}-V_{out2}) \times R_5/(R_4+R_5) \times 0.95$ and being less than $(V_{out1}-V_{out2}) \times R_5/(R_4+R_5) \times 1.05$.

In another embodiment of this application, the outdoor device unit 30 is further configured to determine not to perform the reset operation when the change amount of the working voltage falls beyond the preset range and the duration in which the change amount of the working voltage is within the preset range is less than the preset threshold.

It should be noted that in this embodiment of this application, control on the outdoor device unit may be implemented at a convenient location by using a component associated with the outdoor device unit. Therefore, this embodiment of this application may be applied to various outdoor device units, and the outdoor device units include but are not limited to an outdoor communications unit, monitor, electronic screen, color lamp control, and the like.

Figure 9:
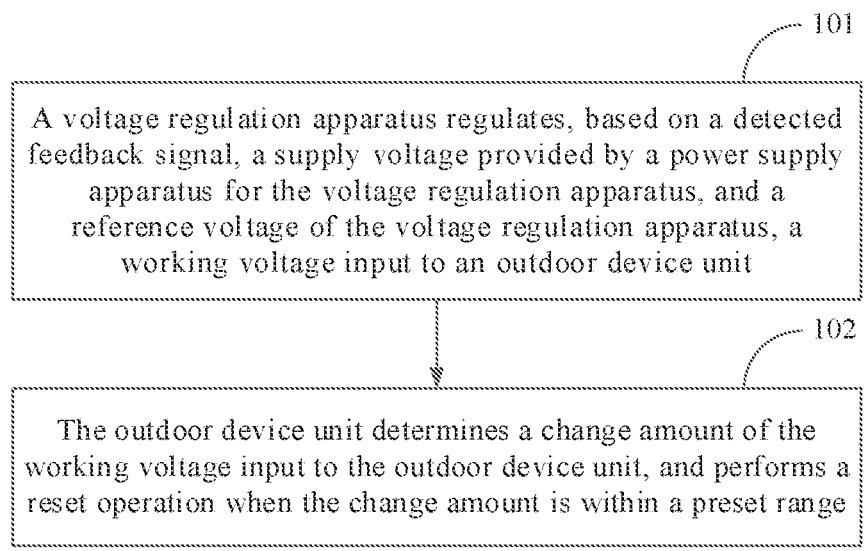
FIG. 9 is a schematic flowchart 1 of an outdoor device unit reset method according to an embodiment of this application.

FIG. 9 is a schematic flowchart of an outdoor device unit reset method. The method may be applied to an outdoor device unit reset system, for example, any one of the outdoor device unit reset systems shown in FIG. 3 to FIG. 7.

For example, when the method is applied to the reset system shown in FIG. 3 (for a specific structure, refer to the description in FIG. 3, and details are not described herein again), the outdoor device unit reset system includes the voltage regulation apparatus 20 and the outdoor device unit 30, and the method includes the following steps.

Step 101: The voltage regulation apparatus 20 regulates, based on a detected feedback signal, a supply voltage provided by the power supply apparatus for the voltage regulation apparatus, and a reference voltage of the voltage regulation apparatus, a working voltage input to the outdoor device unit 30.

The voltage regulation apparatus 20 processes an alternating current provided by the power supply apparatus 10 into a direct current, to output the working voltage to the outdoor device unit 30. In addition, the voltage regulation apparatus 20 may further play a control role in the reset system, to be specific, regulate, based on the detected feedback signal, the supply voltage provided by the power supply apparatus 10 for the voltage regulation apparatus 20, and the reference voltage of the voltage regulation apparatus 20, the working voltage input to the outdoor device unit 30. In other words, the voltage regulation apparatus 20 regulates the supply voltage through triggering of the feedback signal by using the reference voltage as a reference, to implement control on the outdoor device unit 30.

Step 102: The outdoor device unit 30 determines a change amount of the working voltage input to the outdoor device unit 30, and performs a reset operation when the change amount is within a preset range.

The outdoor device unit 30 determines the change amount of the working voltage input to the outdoor device unit 30, and performs the reset operation when the change amount is within the preset range. Through regulation of the voltage regulation apparatus 20, the working voltage input to the outdoor device unit 30 changes. The outdoor device unit 30 may detect the change amount of the working voltage. When the change amount is within the preset range, the reset operation is performed by using built-in software.

This embodiment of this application provides an outdoor device unit reset method. A voltage regulation apparatus regulates, based on a detected feedback signal, a supply voltage provided by a power supply apparatus for the voltage regulation apparatus, and a reference voltage of the voltage regulation apparatus, a working voltage input to an outdoor device unit. The outdoor device unit determines a change amount of the working voltage input to the outdoor device unit, and performs a reset operation when the change amount is within a preset range. This method not only implements remote reset control on the outdoor device unit, but also is not limited by a device binding relationship because the method is an improvement to the voltage regulation apparatus.

Optionally, step 101 may be specifically implemented in the following manner: When it is ensured that the reference voltage is unchanged, the voltage regulation apparatus 20 regulates, based on the feedback signal and the supply voltage, the working voltage input to the outdoor device unit. The reference voltage refers to an ideal value of a voltage of a feedback end of the voltage regulation apparatus 20.

Optionally, when the reset system uses the structure shown in FIG. 4, the voltage regulation apparatus includes the conversion circuit 201 and the reset unit 202 connected to the conversion circuit 201. Step 101 may be specifically implemented in the following manner:

The reset unit 202 inputs the feedback signal to the conversion circuit 201. The conversion circuit 201 regulates, based on the feedback signal, the supply voltage, and the reference voltage, the working voltage input to the outdoor device unit 30.

Specifically, the reset unit 202 generates the feedback signal through the reset operation, and inputs the feedback signal to the conversion circuit 201. Correspondingly, the conversion circuit 201 receives the feedback signal, and after determining that the voltage of the feedback end deviates from the reference voltage, the conversion circuit 201 keeps the voltage of the feedback end unchanged as the reference voltage by regulating the working voltage.

Optionally, the reset switch is in a closed state when the change amount of the working voltage is within the preset range. It should be noted that the change amount of the working voltage of the outdoor device unit 30 may be enabled to be within the preset range by closing the reset switch K, or may be enabled to be within the preset range in a manner other than closing the reset switch K. This is not limited in this embodiment of this application.

Figure 10:
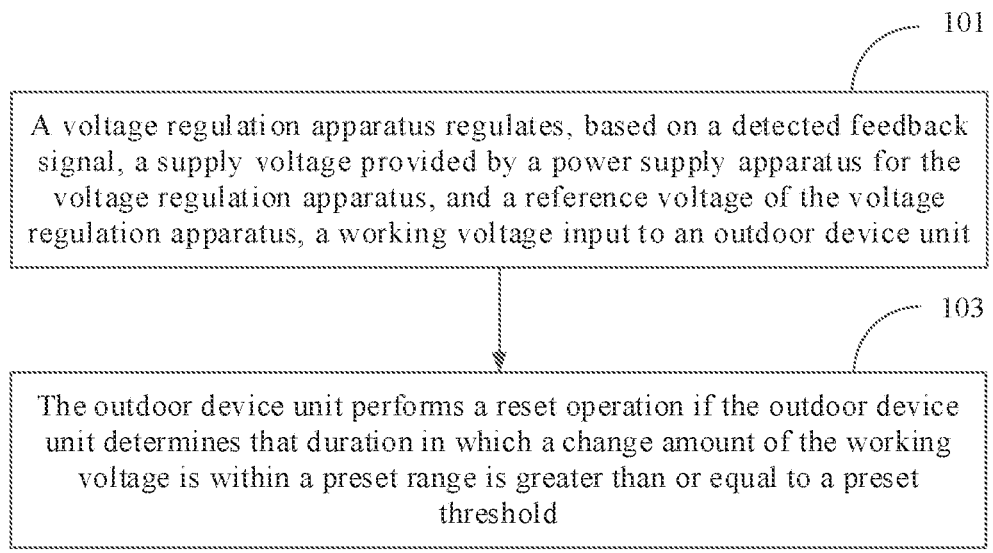
FIG. 10 is a schematic flowchart 2 of an outdoor device unit reset method according to an embodiment of this application.

Optionally, referring to FIG. 10, the method further includes:

Step 103: The outdoor device unit 30 performs the reset operation if the outdoor device unit 30 determines that duration in which the change amount of the working voltage is within the preset range is greater than or equal to a preset threshold.

Optionally, when the reset system uses the structure shown in FIG. 7, the outdoor device unit 30 includes the voltage divider unit 301 and the power management module 302. Step 102 may be specifically implemented in the following manner:

The voltage divider unit 301 divides the working voltage, and inputs a working voltage obtained after the voltage division to the power management module 302. The power management module 302 determines a change amount of the working voltage obtained after the voltage division, and performs the reset operation when the change amount of the working voltage obtained after the voltage division is within the preset range.

Optionally, the preset range is a range including endpoints that is formed by a product of a preset standard change amount and a first percentage and a product of the preset standard change amount and a second percentage, and the first percentage is less than the second percentage. In other words, the change amount of the voltage may fluctuate by using the preset standard change amount as a reference.

Figure 11:
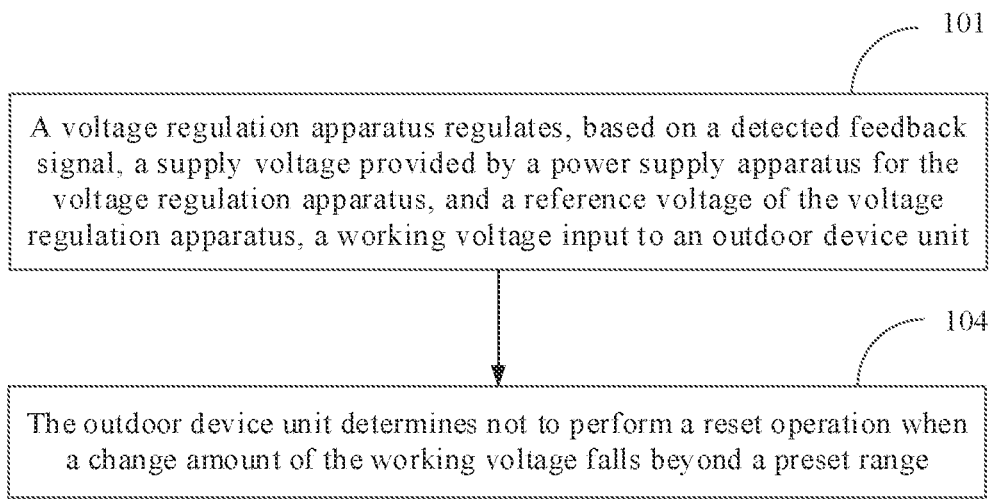
FIG. 11 is a schematic flowchart 3 of an outdoor device unit reset method according to an embodiment of this application.

Optionally, referring to FIG. 11, the method provided in this embodiment of this application further includes:

Step 104: The outdoor device unit 30 determines not to perform the reset operation when the change amount of the working voltage falls beyond the preset range.

Specifically, for the preset range, refer to the descriptions in the foregoing embodiment. Details are not described herein again.

Finally, it should be noted that the foregoing embodiments are merely intended to describe the technical solutions of this application, but not to limit this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

The invention claimed is:

1. A system comprising:
   a power supply apparatus configured to supply a supply voltage;
   an outdoor device configured to:
      determine a change amount of a working voltage; and
      perform a reset operation when the change amount is within a preset range; and
   a voltage regulation apparatus coupled to the power supply apparatus and the outdoor device and configured to:
      detect a feedback signal;
      obtain the supply voltage from the power supply apparatus; and
      regulate the working voltage to the outdoor device based on the feedback signal, the supply voltage, and a reference voltage of the voltage regulation apparatus.

2. The system of claim 1, wherein the voltage regulation apparatus is further configured to regulate, based on the feedback signal and the supply voltage, the working voltage when the reference voltage is unchanged.

3. The system of claim 1, wherein the voltage regulation apparatus comprises:
   a conversion circuit configured to regulate the working voltage based on the feedback signal, the supply voltage, and the reference voltage; and
   a reset component coupled to the conversion circuit and configured to send the feedback signal to the conversion circuit.

4. The system of claim 2, wherein the voltage regulation apparatus comprises:
   a conversion circuit configured to regulate the working voltage based on the feedback signal, the supply voltage, and the reference voltage; and
   a reset component coupled to the conversion circuit and configured to send the feedback signal to the conversion circuit.

5. The system of claim 3, wherein the conversion circuit comprises an output end coupled to the outdoor device, and wherein the reset component comprises:
   a first resistor comprising:
      a first end coupled to the output end; and
      a second end;
   a second resistor comprising:
      a third end coupled to the output end; and
      a fourth end;
   a third resistor comprising:
      a fifth end coupled to a feedback end of the conversion circuit; and
      a sixth end that is grounded; and
   a reset switch comprising:
      a seventh end coupled to the second end; and
      an eighth end coupled to the fourth end and the fifth end.

6. The system of claim 5, wherein the reset switch is in a closed state when the change amount is within the preset range.

7. The system of claim 1, wherein the outdoor device is further configured to:
   make a determination that a duration that the change amount is within the preset range is greater than or equal to a preset threshold; and
   further perform, in response to the determination, the reset operation.

8. The system of claim 2, wherein the outdoor device is further configured to:
   make a determination that a duration that the change amount is within the preset range is greater than or equal to a preset threshold; and
   further perform, in response to the determination, the reset operation.

9. The system of claim 3, wherein the outdoor device is further configured to:
   make a determination that a duration that the change amount is within the preset range is greater than or equal to a preset threshold; and
   further perform, in response to the determination, the reset operation.

10. The system of claim 1, wherein the outdoor device comprises:
    a voltage divider coupled to an output end of the voltage regulation apparatus and configured to:
       divide the working voltage to obtain a second working voltage; and
       output the second working voltage; and
    a power management component coupled to the voltage divider and configured to:
       obtain the second working voltage;
       determine a second change amount of the second working voltage; and
       further perform the reset operation when the second change amount is within the preset range.

11. The system of claim 2, wherein the outdoor device comprises:
    a voltage divider coupled to an output end of the voltage regulation apparatus and configured to:
       divide the working voltage to obtain a second working voltage; and
       output the second working voltage; and
    a power management component coupled to the voltage divider and configured to:
       obtain the second working voltage;
       determine a second change amount of the second working voltage; and
       further perform the reset operation when the second change amount is within the preset range.

12. The system of claim 3, wherein the outdoor device comprises:
    a voltage divider coupled to an output end of the voltage regulation apparatus and configured to:
       divide the working voltage to obtain a second working voltage; and
       output the second working voltage; and
    a power management component coupled to the voltage divider and configured to:
       obtain the second working voltage;
       determine a second change amount of the second working voltage; and
       further perform the reset operation when the second change amount is within the preset range.

13. The system of claim 5, wherein the outdoor device comprises:
    a voltage divider coupled to an output end of the voltage regulation apparatus and configured to:
       divide the working voltage to obtain a second working voltage; and
       output the second working voltage; and
    a power management component coupled to the voltage divider and configured to:
       obtain the second working voltage;
       determine a second change amount of the second working voltage; and further perform the reset operation when the second change amount is within the preset range.

14. The system of claim 10, wherein the voltage divider comprises:
   a fourth resistor comprising:
      a first end coupled to the output end of the voltage regulation apparatus; and
      a second end;
   a fifth resister comprising:
      a third end coupled to the second end and the power management component; and
      a fourth end that is grounded; and
   a first capacitor comprising:
      a fifth end coupled to the third end; and
      a sixth end coupled to the fourth end.

15. The system of claim 14, wherein the preset range comprises endpoints that are formed by a first product of a preset standard change amount and a first percentage and a second product of the preset standard change amount and a second percentage, and wherein the first percentage is less than the second percentage.

16. The system of claim 1, wherein the outdoor device is further configured to avoid performing the reset operation when the change amount is beyond the preset range.

17. The system of claim 2, wherein the outdoor device is further configured to avoid performing the reset operation when the change amount is beyond the preset range.

18. The system of claim 3, wherein the outdoor device is further configured to avoid performing the reset operation when the change amount is beyond the preset range.

19. A method comprising:
   regulating, by a voltage regulation apparatus, a working voltage of an outdoor device based on a feedback signal and a supply voltage from a power supply apparatus for the voltage regulation apparatus when a reference voltage of the voltage regulation apparatus is unchanged;
   determining, by the outdoor device, a change amount of the working voltage; and
   performing, by the outdoor device, a reset operation when the change amount is within a preset range.

20. A computer program product comprising instructions stored on a non-transitory computer-readable medium that, when executed by a processor, cause an electronic device to:
   regulate, by a voltage regulation apparatus, a working voltage of an outdoor device based on a feedback signal and a supply voltage from a power supply apparatus for the voltage regulation apparatus when a reference voltage of the voltage regulation apparatus is unchanged;
   determine, by the outdoor device, a change amount of the working voltage; and
   perform, by the outdoor device, a reset operation when the change amount is within a preset range.

* * * * *